(12) United States Patent
Chandra et al.

(10) Patent No.: US 8,479,067 B2
(45) Date of Patent: Jul. 2, 2013

(54) TEST ARCHITECTURE INCLUDING CYCLICAL CACHE CHAINS, SELECTIVE BYPASS SCAN CHAIN SEGMENTS, AND BLOCKING CIRCUITRY

(75) Inventors: Anshuman Chandra, Sunnyvale, CA (US); Jyotirmoy Saikia, Bangalore (IN); Rohit Kapur, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 456 days.

(21) Appl. No.: 12/762,048

(22) Filed: Apr. 16, 2010

(65) Prior Publication Data
US 2011/0258498 A1 Oct. 20, 2011

(51) Int. Cl.
*G01R 31/28* (2006.01)
(52) U.S. Cl.
USPC .......................................................... 714/729
(58) Field of Classification Search
USPC .................... 714/724, 726, 729, 30; 716/100, 716/104
See application file for complete search history.

(56) References Cited

U.S. PATENT DOCUMENTS

| | | | |
|---|---|---|---|
| 6,615,380 B1 | 9/2003 | Kapur et al. | |
| 7,418,640 B2 | 8/2008 | Kapur et al. | |
| 7,945,833 B1 * | 5/2011 | Wang et al. | 714/729 |
| 8,015,461 B2 * | 9/2011 | Rajski et al. | 714/726 |
| 2001/0056559 A1 | 12/2001 | Whetsel | |
| 2008/0256497 A1 | 10/2008 | Wohl et al. | |
| 2009/0119559 A1 | 5/2009 | Foutz et al. | |
| 2010/0192030 A1 | 7/2010 | Kapur et al. | |
| 2011/0289369 A1 * | 11/2011 | Lee et al. | 714/726 |

OTHER PUBLICATIONS

Dutta et al. "Using limited dependence sequential expansion for decompressing test vectors", Proc. of Int. Test Conf. 2006, pp. 1-9.
Agrawal et al. "A Complete Solution to the Partial Scan Problem", IEEE International Test Conference, 1987, pp. 44-51.
Mrugalski et al. "Compression Based on Deterministic Vector Clustering of Incompatible Test Cubes", IEEE International Test Conference, 2009, pp. 1-10.
Jas et al. "Test Vector Decompression via Cyclical Scan Chains and Its Application to Testing Core-Based Designs", IEEE Int. Test Conf., 1998, pp. 458-464.
Chandra et al. "Scalable Adaptive Scan", IEEE Design Automation and Test in Europe, 2009, pp. 1476-1481.

* cited by examiner

*Primary Examiner* — Phung M Chung
(74) *Attorney, Agent, or Firm* — Bever, Hoffman & Harms, LLP; Jeanette S. Harms

(57) ABSTRACT

A test architecture adds minimal area overhead and increases encoding bandwidth by using one or more cyclical cache chains for a set of the test patterns provided to the scan chains of the design. A multiplexer associated with a scan chain can be used to bypass a segment of the scan chain that includes unknown values. Blocking circuitry can be programmed to completely block one or more scan chains including unknown values. The test architecture can include control logic for selecting between a linear mode and a cyclical mode. In the linear mode, only top level scan inputs are mapped to the scan chains. In the cyclical mode, outputs of the plurality of cyclical cache chains and top level scan inputs are mapped to the scan chains.

25 Claims, 8 Drawing Sheets

TEST ARCHITECTURE INCLUDING CYCLICAL CACHE CHAINS, SELECTIVE BYPASS SCAN CHAIN SEGMENTS, AND BLOCKING CIRCUITRY

BACKGROUND OF THE INVENTION

1. Field of the Invention

The present invention relates to test architectures and, in particular to cyclical cache chains, selective bypass scan chain segments, and blocking circuitry that can facilitate maintaining test application time over generations of technology.

2. Related Art

Scan compression refers to techniques of reducing the amount of data needed to test integrated circuits. Reducing the amount of data can advantageously reduce test application time on expensive ATE (automated test equipment). Reducing the amount of data can also advantageously reduce tester memory and allow for increased pattern counts, thereby extending the life of existing ATE equipment. Logic BIST (built-in self-test), which is known by those skilled in the art of test, can also facilitate significant data compression.

Scan compression can also achieve test application time reductions by reducing scan chain lengths. For example, FIG. 1 illustrates a test architecture 100 that includes a plurality of scan cells 103. Specifically, two scan inputs 101A and 101B can be provided to two scan chains, each scan chain having 12 serially-connected scan cells. The test architecture of FIG. 1 provides two scan outputs 102A and 102B.

FIG. 2 illustrates another test architecture 200 that includes the same number of scan cells 203 as test architecture 100, but increases the number of scan chains from 2 to 6. This increase in the number of scan chains can advantageously reduce the length of each scan chain to 4, thereby reducing the test application time by one-third (i.e. test application time=patterns×scan chain length). Notably, test architecture 200 can use the same scan interface as test architecture 100. That is, test architecture 200 provides two scan inputs 201A and 201B as well as two scan outputs 202A and 202B (which are generated by a compressor 205). An ATE generally has a limit on the scan chain length that can be analyzed. Because an ATE is extremely expensive and therefore is used for multiple technology nodes, the number of scan chains used for test has increased rather than increasing the scan chain length.

Note that in test architecture 200, a decompressor 204 can map scan inputs 201A and 201B (and/or their derivatives via logic and/or sequential elements, not shown for convenience) to the six scan chains. Thus, the values provided to scan cells 203 can have dependencies. For example, because scan inputs 201A and 201B can supply values to six scan cells per clock cycle, on average three scan cells would have the same (or inverted) values. Notably, increasing the ratio of the number of scan chains to the number of scan inputs would increase the dependencies. Such increased dependencies could increase the pattern count.

Thus, both scan chain length and pattern count can impact test application time. As a result, test application time can be reduced by minimizing pattern inflation, providing more scan chains, and/or partial shifting. Note that in partial shifting, a subset of the total number of scan chains directly receives top level scan inputs (i.e. from external sources, such as a pin) and the rest of the scan chains receive scan inputs from a decompressor.

Assuming ATPG (automatic test pattern generation) has maximum efficiency, pattern count can only be reduced by increasing the test data bandwidth to the decompressor such that ATPG can compact multiple patterns into one pattern. As noted above, creating more scan chains can increase the dependencies between values across scan cells, which may increase pattern inflation and perhaps diminish returns in the overall test application time. Increasing bandwidth to the decompressor can allow for more aggressive scan chain ratios if pattern inflation is limited. Partial shifting methods may result in the effective scan chain lengths varying on a per pattern basis, which does not work well with existing tester architectures.

Therefore, a need arises for increasing the test data bandwidth to the decompressor while minimizing scan cell dependencies, limiting pattern inflation, and ensuring compatibility with existing tester architectures.

SUMMARY OF THE INVENTION

In accordance with one aspect of an improved test architecture for testing of an integrated circuit design, increased encoding bandwidth can be made available to the decompressor for improving the pattern count of compressed patterns. This increased bandwidth can advantageously minimize test application time.

To provide this increased bandwidth, a test architecture can include a plurality of scan chains, a plurality of cyclical cache chains, a decompressor, a compressor, and inverting logic. The decompressor can receive scan inputs and map the scan inputs to the plurality of scan chains and the plurality of cyclical cache chains. The compressor can receive outputs of the scan chains and the cyclical cache chains, and generate scan outputs. The inverting logic can invert one or more values from the cyclical cache chains and generating a subset of the scan inputs for the decompressor.

In one embodiment, control logic can be used for selecting between a linear mode and a cyclical mode. In the linear mode, only top level scan inputs are mapped to the scan chains. In the cyclical mode, outputs of the cyclical cache chains and top level scan inputs are mapped to the scan chains. Note that in either mode, the outputs of the cyclical cache chains may be blocked from entering the compressor or may be permitted to enter the compressor, depending on a scan enable signal controlling the scan cells of the cyclical cache chains. In one embodiment, software can dynamically determine whether the scan enable signal is asserted (allowed to capture) or de-asserted (prohibited from capture). When allowed to capture, the values stored by the scan cells are randomized due to circuit response. Therefore, there can be some advantages to asserting the scan enable signal for the cyclical mode.

Another test architecture for testing of an integrated circuit design is described. This test architecture can include a plurality of scan chains, a decompressor, and a compressor. The decompressor can receive scan inputs and map the scan inputs to the scan chains. The compressor can receive outputs of the scan chains and generate scan outputs. Notably, at least one scan chain can include a first segment, a second segment, and a multiplexer for receiving outputs of the first and second segments and allowing selective bypass of the second segment.

Yet another test architecture for testing of an integrated circuit design is described. This test architecture can include a plurality of scan chains, a decompressor, blocking circuitry, and a compressor. The decompressor can receive scan inputs and map the scan inputs to the scan chains. The blocking circuitry can programmably block one or more outputs of the scan chains. The compressor can receive outputs of the blocking circuitry and generate scan outputs.

In one embodiment, a test architecture can further include a set-up register for storing one or more values that control the cyclical cache chains, the multiplexer, or the blocking circuitry. Note that in one embodiment, a test architecture can include the above-described cyclical cache chains, the inverting logic, the multiplexer, and the blocking circuitry.

A computer-readable medium comprising computer instructions that, when run on a computer, perform steps for testing of an integrated circuit design is also described. These steps include receiving scan inputs and mapping the scan inputs to a plurality of scan chains and a plurality of cyclical cache chains. First outputs of the plurality of scan chains and second outputs of the plurality of cyclical cache chains are received, at which point scan outputs from the first and second outputs can be generated. One or more values from the cyclical cache chains can be inverted, the inverted values being a subset of the scan inputs. Selection between a linear mode and a cyclical mode can be made. In the linear mode, only top level scan inputs are mapped to the scan chains. In the cyclical mode, outputs of the plurality of cyclical cache chains and top level scan inputs are mapped to the scan chains.

Another computer-readable medium comprising computer instructions that, when run on a computer perform steps for testing of an integrated circuit design, is described. These steps include receiving scan inputs and mapping the scan inputs to a plurality of scan chains, wherein at least one scan chain includes a first segment and a second segment. First outputs of the plurality of scan chains can be received, at which point scan outputs from the first outputs can be generated. Notably, receiving the first outputs includes receiving outputs of the first and second segments and allowing selective bypass of the second segment.

Yet another computer-readable medium comprising computer instructions that, when run on a computer, perform steps for testing of an integrated circuit design is described. These steps include receiving scan inputs and mapping the scan inputs to the plurality of scan chains. One or more outputs of the plurality of scan chains can be programmably blocked. Outputs of the scan chains can be received after blocking and scan outputs can then be generated.

DETAILED DESCRIPTION OF THE FIGURES

In accordance with one embodiment of test architecture, more bandwidth for encoding patterns can be provided by one or more cyclical feedback loops. Blocking and bypass circuitry can also be provided to enhance this bandwidth.

Figure 3:
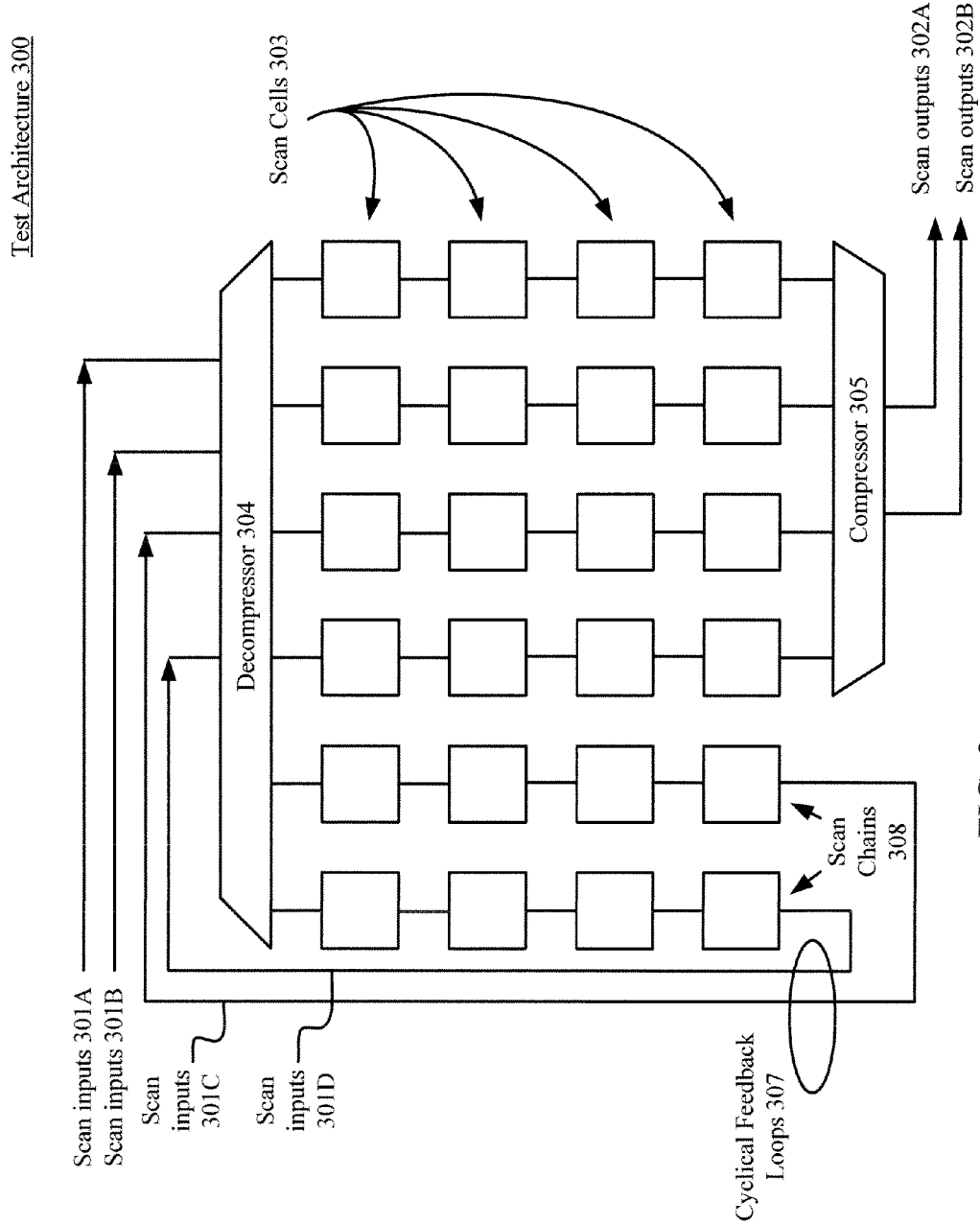
FIG. 3 illustrates an exemplary test architecture including cyclical feedback loops.

FIG. 3 illustrates an exemplary test architecture 300 including two cyclical feedback loops 307. In this embodiment, two top level scan inputs 301A and 301B as well as two internally-generated scan inputs 301C and 301D can be provided to a decompressor 304. Notably, internally-generated scan inputs 301C and 301D are provided by cyclical feedback loops 307.

In one embodiment, the scan chains associated with cyclical feedback loops 307, i.e. scan chains 308, have been determined (e.g. after running ATPG) to be less significant contributors of test pattern results, thereby freeing those scan chains to supply data for test patterns (i.e. data supplied by the last test pattern can be used as input to the next test pattern) in a cyclical mode of decompressor 304. In another embodiment, the scan chains associated with cyclical feedback loops 307 can be arbitrarily designated.

Note that during a cyclical mode, the scan cells used for extra bandwidth can provide the stimulus for the test pattern but cannot be used for observation. Therefore, in one embodiment (described in further detail in reference to control logic 613, FIG. 6), to prevent the need for sequential ATPG algorithms in configuration 300, the scan cells of scan chains 308 can be disabled from capturing data during the capture cycle or made to capture the previous scan values. Logically, because the values of the scan cells of scan chains 308 are not scanned out to an ATE, no faults can be detected in those scan cells. Notably, cyclical feedback loops 307 and their corresponding scan inputs 301C and 301D can advantageously increase encoding bandwidth for test architecture 300. In one embodiment, a compressor 305 can be configurable to implement both test architecture 300 during the cyclical mode and test architecture 200 during a linear mode.

Figure 4:
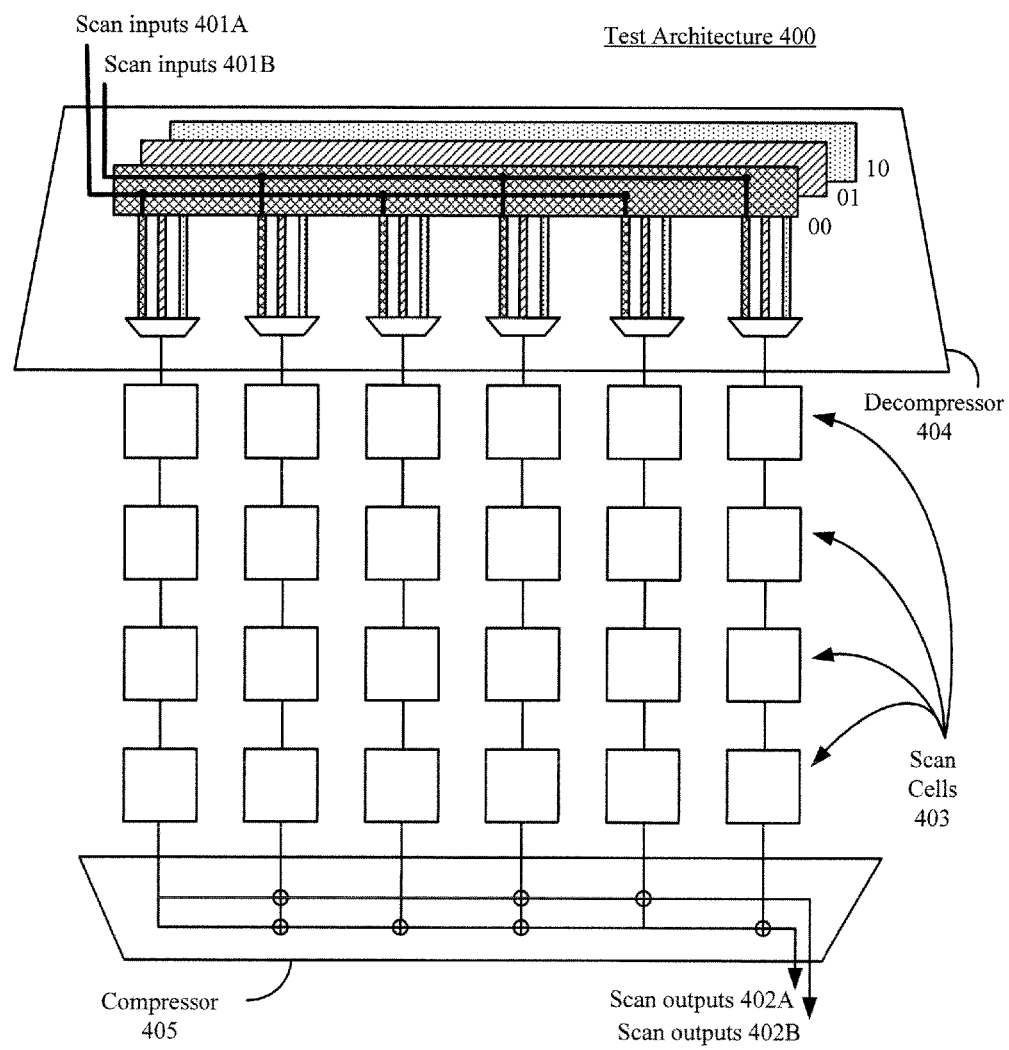
FIG. 4 illustrates an exemplary test architecture that provides an adaptive scan capability.

FIG. 4 illustrates an exemplary test architecture 400 that provides an adaptive scan capability using scan inputs 401A and 401B. In this embodiment, test architecture 400 includes a decompressor 404 based on multiplexors and a compressor 405 based on exclusive OR (XOR) gates. The multiplexers of decompressor 404 can advantageously provide dynamic control of the mode signals (labeled as "00", "01", and "10" and different fill patterns to indicate inputs to the multiplexers, wherein different modes can provide different mappings (one mapping shown for mode 00)), which can reroute any of the top level scan inputs to a scan input on a per shift basis. This mapping can provide a very efficient way to handle the input scan cell dependencies. In compressor 405, redundancy can be built in the XOR connections so that a single scan chain can be observed at multiple outputs, i.e. at both scan outputs 402A and 402B.

When higher compression is targeted, the ratio of the scan chains to scan inputs can become a very high number. In this case, decompressor 404 either becomes very inefficient or is unable to generate the scan data required for fault sensitization and propagation. When unable to generate the scan data, decompressor 404 can be characterized as being in a "lock" state.

Figure 5:
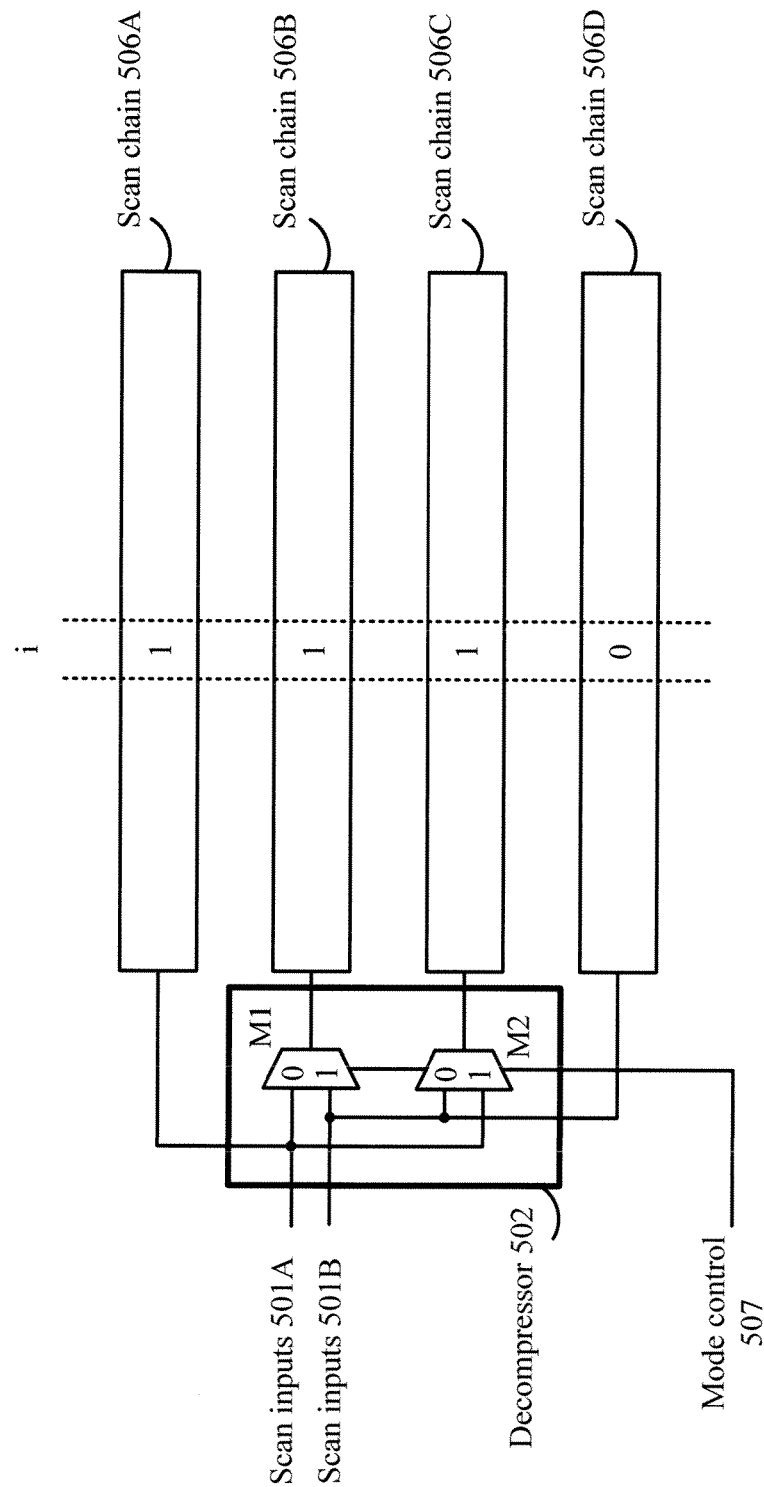
FIG. 5 illustrates a simple circuit that exhibits a lock state.

For further explanation of this lock state, FIG. 5 illustrates a simple circuit including four scan chains 506A, 506B, 506C, and 506D that can receive two scan inputs 501A and 501B via a decompressor 502. In this embodiment of decompressor 502, two multiplexers M1 and M2 can provide two modes using a mode control signal 507. In a first mode (mode control signal 507=0), scan chains 506A and 506B can be connected to scan input 501A and scan chains 506B and 506C can be connected to scan input 501B. In contrast, in a second mode (mode control signal 507=1), scan chains 501A and 501C can be connected to scan input 501A and scan chains 506B and 506D can be connected to scan input 501B. Consider any shift position i. If the values required in scan chains 506A, 506B, 506C, and 506D for shift position i are {1, 1, 1, 0}, respectively, then those values cannot be supplied by decompressor 502. Hence, decompressor 502 is in lock state.

Figure 6:
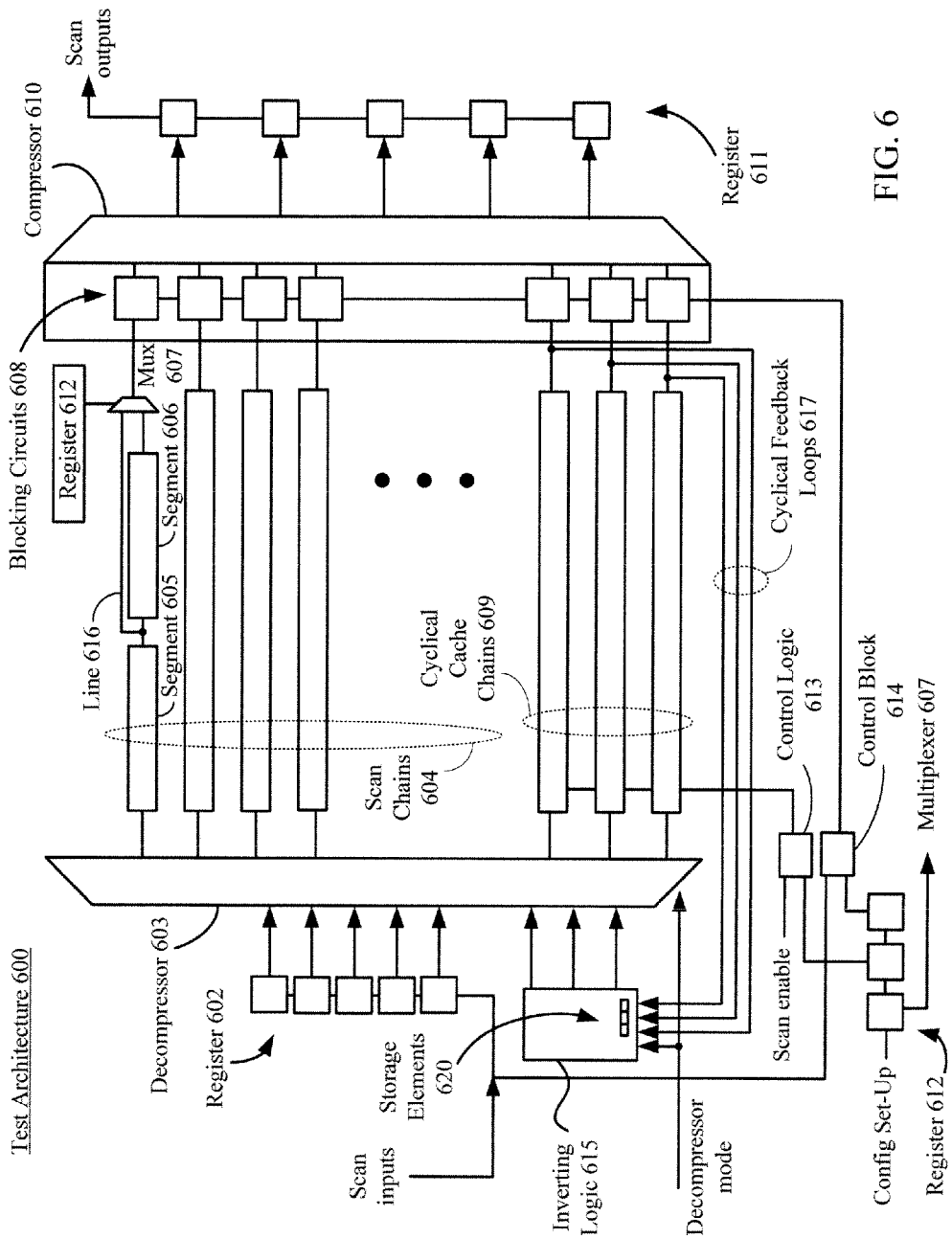
FIG. 6 illustrates an exemplary test architecture that includes cyclical feedback loops, blocking circuitry, and bypass circuitry.

FIG. 6 illustrates an exemplary test architecture 600 including a decompressor with inverting logic to provide bit diversity, thereby avoiding a lock state. In one embodiment, the scan inputs can be serially loaded into a register 602 and also provided to control block 614, which may serially load blocking circuitry 608 (described below) when enabled (from a bit in a register 612). Register 602 can provide its stored values to a decompressor 603. U.S. patent application Ser. No. 12/362,284, which was filed on Jan. 29, 2009 and is incorporated by reference herein, describes exemplary registers and decompressors. A plurality of scan chains 604 and a plurality of cyclical cache chains 609 can receive the outputs of decompressor 603.

As described above, cyclical cache chains 609 may have been determined (e.g. by test generation) to provide few if any test values and therefore have been designated for use in the cyclical mode (but can be loaded during the linear mode in which scan chains 604 receive only top level scan inputs via register 602 and decompressor 603). In a linear mode, the outputs of scan chains 604 and cyclical cache chains 609 can be provided to blocking circuits 608 (described below). A compressor 610 can receive the outputs of blocking circuits 608 and generate signals that can be loaded into a register 611. Register 611 can serially unload the scan outputs. U.S. patent application Ser. No. 12/362,284, which was filed on Jan. 29, 2009 and is incorporated by reference herein, describes exemplary compressors, registers, and other post-compressor elements.

As shown in FIG. 6, in addition to being provided to blocking circuits 608, the outputs of cyclical cache chains 609 can also be provided to inverting logic 615 via cyclical feedback loops 617. Note that inverting logic 615 can invert one or more of the outputs of cyclical cache chains 609. In one embodiment, the optimized inversion can be determined based on (i.e. changed for) each test pattern. Inverting logic 615 can provide scan inputs to decompressor 603 (along with the top level scan inputs provided by register 602).

Figure 1:
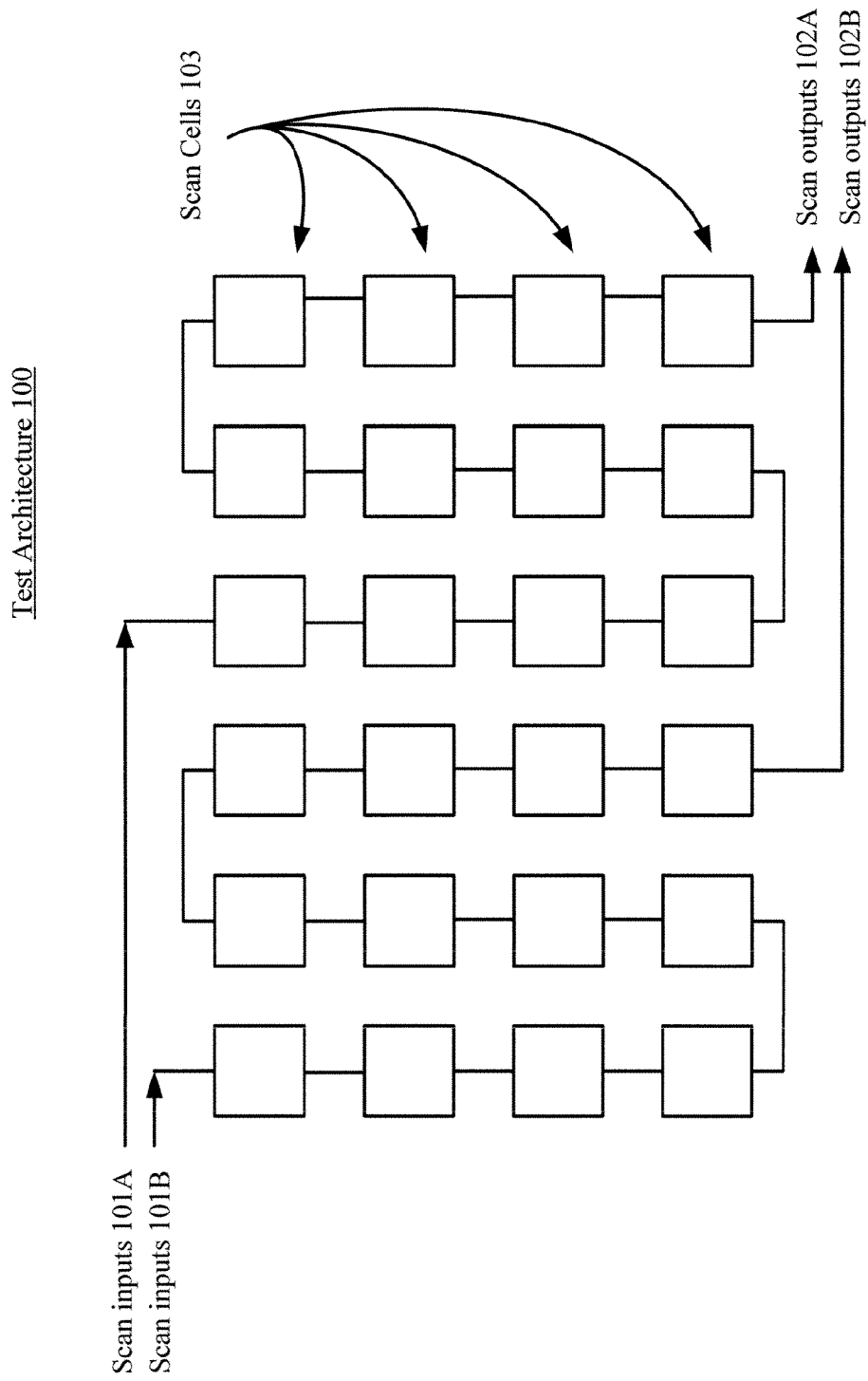
FIG. 1 illustrates an exemplary test architecture in which the scan chains directly receive top level scan inputs.
Figure 2:
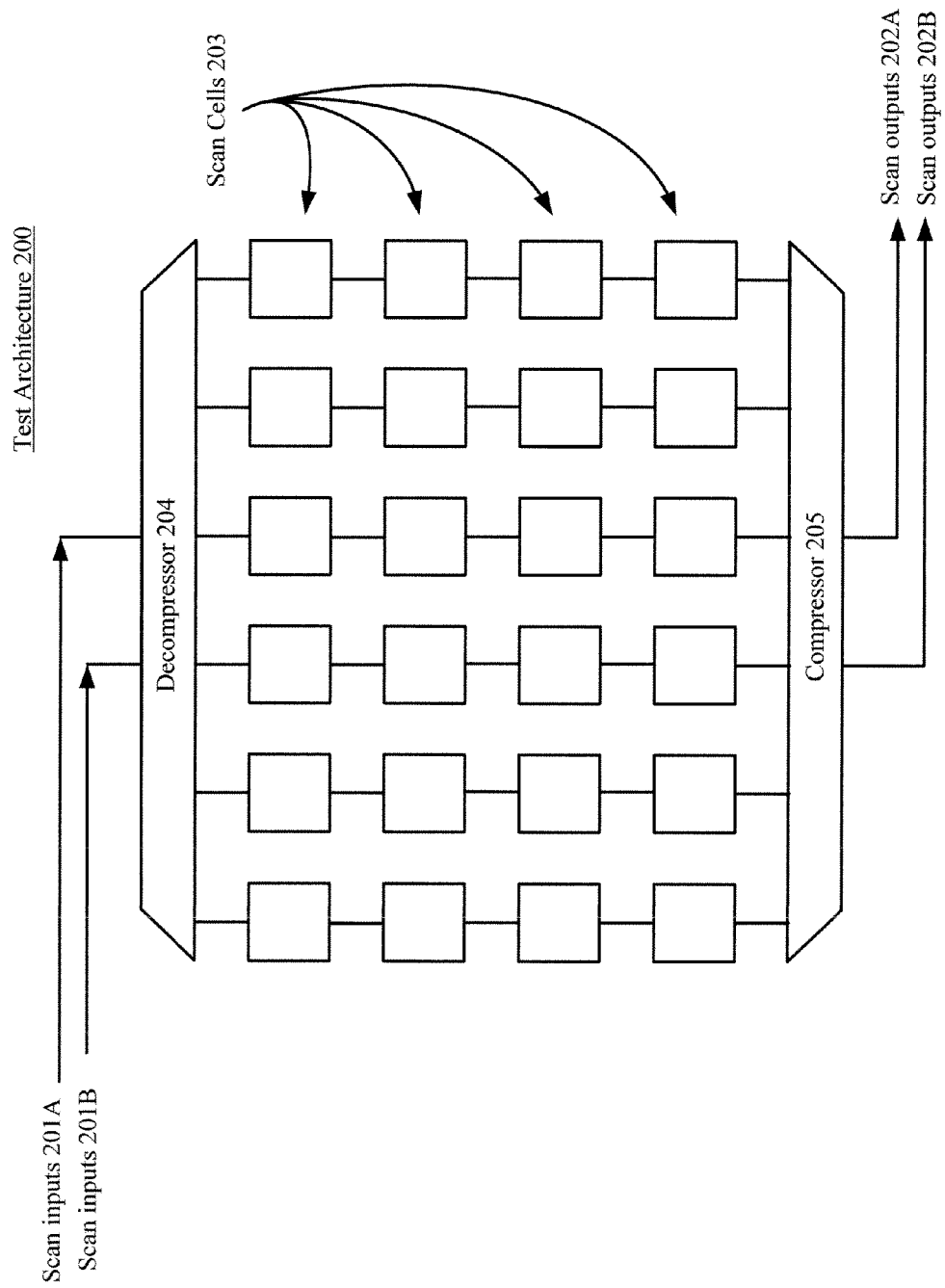
FIG. 2 illustrates another exemplary test architecture in which the scan chains receive scan inputs via a decompressor.

Assume a standard, test architecture (e.g. test architecture 200, FIG. 2) has I scan inputs and N scan chains. Then an adaptive decompressor (e.g. decompressor 304, FIG. 3) can be designed with (I−M) scan inputs feeding N scan chains and M decompressor mode inputs. Referring back to FIG. 6, to avoid lock state, decompressor 603 can include an additional mode where the available number of scan inputs is larger than (I−M). For example, if there are P cyclical cache inputs that can be provided to decompressor 603 (shown as 3 outputs of inverter logic 615), then decompressor 603 can have (I−M+P) inputs feeding N scan chains (which includes scan chains 604, but not cyclical cache chains 609). These P cyclical cache inputs can advantageously alter the scan chain dependencies, thereby enabling decompressor 603 to target the same faults with a different set of scan inputs during the cyclical mode.

Notably, these cyclical cache inputs can be supplied to decompressor 603 (and specifically to scan chains 604) every shift cycle of scan chains 604 (noting that cyclical cache chains 609 have the same shift cycle). In other words, cyclical cache chains 609, in the cyclical mode of decompressor 603, can be characterized as cache chains that store data used to generate the next test pattern to be provided to one or more of scan chains 604 in lieu of the bits from register 602. When cyclical cache chains 609 are not being used for pattern generation, decompressor 603 is in its linear mode, wherein scan chains 604 receive only top level scan inputs. More specifically, in the linear mode, both scan chains 604 and cyclical cache chains 609 receive scan inputs from registers 602 and provide their outputs to X blocking circuit 608 (optional) and compressor 610.

In one embodiment, a configuration set-up register 612 can be used to minimize the number of top level (i.e. external/pin) signals provided to test architecture 600. Note that the scan cells of scan chains 604 as well as cyclical cache chains 609 are configured to be loaded serially or to pass values based on their coupled functional logic as part of a circuit response. A multiplexer typically selects between these configurations, which is well known in test architectures. For example, U.S. Pat. No. 7,418,640, which issued on Aug. 26, 2008 and is incorporated by reference herein, describes an exemplary configuration multiplexer performing this function. In one embodiment, the multiplexers associated with scan chains 604 and cyclical cache chains 609 can receive different control signals, thereby allowing their separate control. This aspect is shown in FIG. 6, wherein control logic 613 can receive a scan enable signal as well as a bit from set-up register 612. Control logic 613 can control asserting/de-asserting the scan enable feature of the scan cells of cyclical cache chains 609. The control logic for controlling the scan cells of scan chains 604 is not shown for simplicity. Note that the configuration set-up signal can be changed for each pattern, thereby increasing the flexibility of test architecture 600.

In one embodiment, in either the linear mode or the cyclical mode, the outputs of cyclical cache chains 609 may be blocked from entering compressor 610 or may be permitted to enter compressor 610, depending on a scan enable signal provided to control logic 613. In one embodiment, simulation tool (i.e. software of the ATE) can dynamically determine whether the scan enable signal is asserted (allowed to capture) or de-asserted (prohibited from capture). When allowed to capture, the values stored by the scan cells are randomized due to circuit response. Therefore, there can be some advantages to asserting the scan enable signal for the cyclical mode.

During functional capture, the simulation tool may be unable to determine a true binary value for one or more scan cells, i.e. unknown values. U.S. Publication 2008/0256497, which was published on Oct. 16, 2008 and is incorporated by reference herein, describes certain techniques for handling such unknown values. These unknown (X) values can be logically combined with known values in compressor 610, thereby creating additional unknown values. Control block 614 can be used to control blocking circuitry 608, each scan chain 604 and cyclical cache chain 609 providing its output to one X blocking circuit in blocking circuitry 608. In one embodiment, when the number of X values of the scan cells in a chain (i.e. one of scan chains 604 or cyclical cache chains 609) exceeds a predetermined threshold (with circuit to circuit variation) or a certain grouping of X values (e.g. one grouping of 50 consecutive X values in a 1000 bit scan chain versus 5 groups of 10 X values distributed in the same 1000 bit scan chain), then control block 614 can allow the transfer of an appropriate signal (from the scan inputs) that triggers the associated X blocking circuit to block outputs of that chain from entering compressor 610. At that point, the associated X blocking circuit can generate a logic zero signal to be provided to compressor 610, which would not affect the encoding done by compressor 610. As noted above, the signals for the blocking circuits of blocking circuitry 608 can be loaded serially using control block 614 (e.g. if there are 50 X blocking circuits, then 50 clock cycles are needed to load all blocking circuits).

In one embodiment, when only one segment of a chain has X values, these X values may be bypassed using a multiplexer. For example, assume that the top-most scan chain 604 in FIG. 6 has known values in segment 605, but unknown values in segment 606. In this case, a multiplexer 607 can advantageously bypass the unknown values in segment 606, i.e. by selecting a line 616 connected to the output of segment 605 rather than segment 606. Thus, multiplexer 607 can target specific segments of the chains having X values, whereas blocking circuitry 608 can target entire chains of X values. In one embodiment, multiplexer 607 can be controlled by a bit of register 612.

Cyclical cache chains 609 are connected to decompressor 603 with certain conditions in mind. For example, because absolute control of the bits that are loaded in cyclical cache chains 609 is needed, cyclical cache chains 609 are always connected to the top level scan inputs (i.e. bits from register 602) in both the linear and cyclical modes. Otherwise, if cyclical cache chains 609 are connected back to themselves through the cyclical cache inputs, then the same data will recycle, thereby adversely affecting test pattern generation. Therefore, the number of cyclical cache chains 609 should be always less than or equal to top level scan inputs (e.g. the bits provided by register 602) to ensure full control on the bits coming back through the P cyclical cache inputs. In one embodiment, the number of cyclical cache chains can be a very small subset of the total number of chains, e.g. 2% of the total.

Furthermore, cyclical cache chains 609 are preferably indirectly connected to decompressor 603, i.e. via inverting logic 615. This indirect connection can advantageously result in different input bits on the cyclical cache inputs being made available for each of the M decompressor modes, thereby increasing test generation efficiency. Note that the number of decompressor modes can be circuit dependent, i.e. more complex circuits may benefit from more decompressor modes. In one embodiment, multiple cyclical modes and multiple linear modes can be provided, each mode providing a predetermined mapping of scan inputs from register 602 and inverting logic 615 to scan chains 604 and cyclical cache chains 609. As noted in FIG. 6, the bits for the decompressor mode can be provided to both inverting logic 615 and decompressor 603. In one embodiment, these bits can be top-level bits (see, e.g. U.S. Pat. No. 7,418,640, which is incorporated by reference herein) that can change on each shift cycle. Note that these bits can be cached in a register (not shown) if these bits are loaded with the scan inputs, for example.

Choosing cyclical cache chains 609 can also be performed with certain conditions in mind. For example, in one embodiment, cyclical cache chains 609 can be chosen from as many clock domains as possible so as to have minimum impact on fault sensitization. Also, cyclical cache chains 609 should be substantially equal to the length of the longest scan chain 604 so as to not increase testing time. In one embodiment, cyclical cache chains 609 use additional storage elements (e.g. flip-flops, not shown) at the input of decompressor 603 to store the shift values during the capture cycle. In another embodiment, additional storage elements 620 can be provided in inverting logic block 615, which are positioned before the inverting logic.

Figure 7:
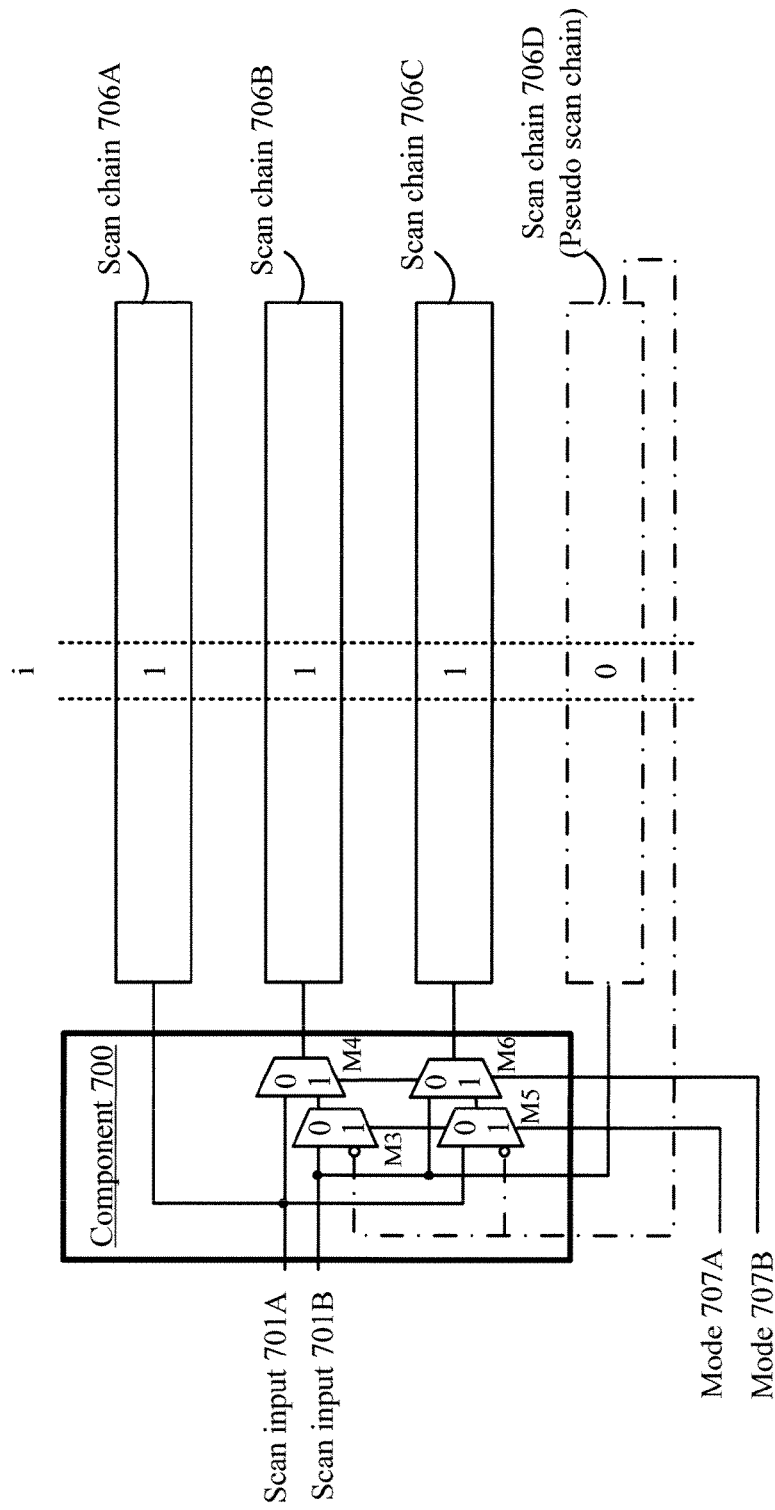
FIG. 7 illustrates using a cyclical mode to address a lock state in the decompressor.

FIG. 7 illustrates a simplified component 700 that combines inverting logic and a decompressor using multiplexers M3, M4, M5, and M6. In this embodiment, scan chain 706D has been reconfigured as a cyclical cache chain. In the cyclical mode, scan chains 706B and 706C are connected to the output of scan chain 706D with an inversion (mode control signals 707A and 707B=1). If in the previous pattern, a value 0 is loaded in scan chain 706D, then in the cyclical mode, all the required scan in values in shift position i can be provided by assigning scan input 701A=1 and scan input 701B=0.

Notably, based on empirical data using the adaptive scan architecture having a cyclical mode, the compression obtained on test data volume is proportional to the savings in test application time. Thus, unlike other sequential compression schemes that provide only high test data volume reduction, the adaptive scan architecture can advantageously deliver savings on both test time and test data.

Figure 8:
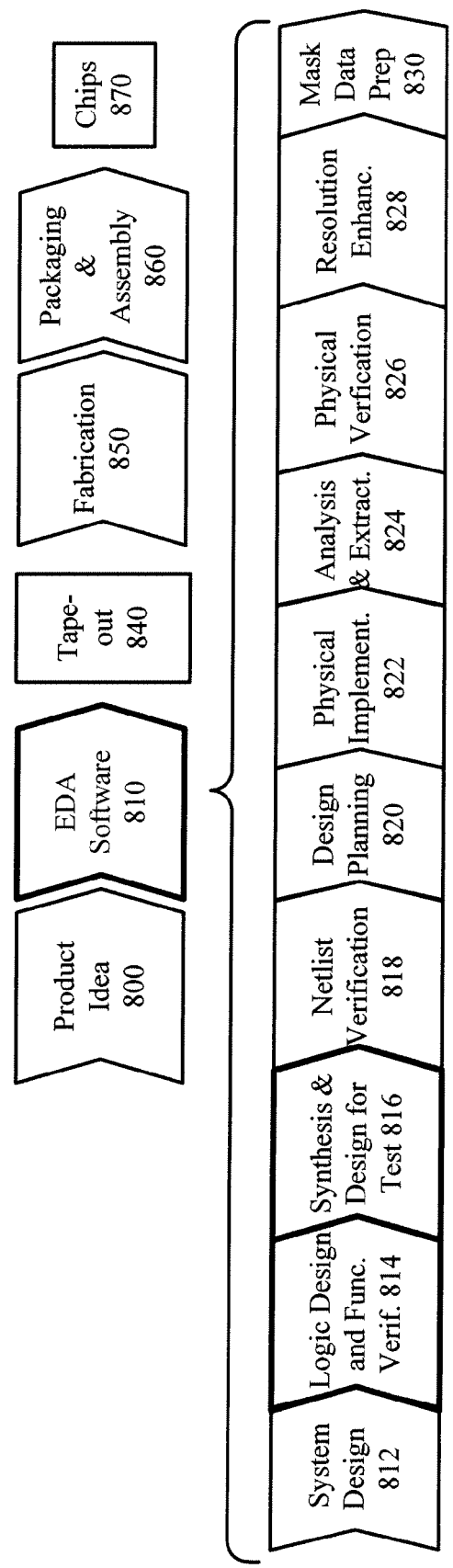
FIG. 8 illustrates a simplified representation of an exemplary digital ASIC design flow.

FIG. 8 shows a simplified representation of an exemplary digital ASIC design flow. At a high level, the process starts with the product idea (step 800) and is realized in an EDA software design process (step 810). When the design is finalized, it can be taped-out (event 840). After tape out, the fabrication process (step 850) and packaging and assembly processes (step 860) occur resulting, ultimately, in finished chips (result 870).

The EDA software design process (step 810) is actually composed of a number of steps 812-830, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 810) will now be provided:

System design (step 812): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 814): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products. In one embodiment, test architecture 600 can be operated and verified during this step.

Synthesis and design for test (step 816): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, Tetramax, and DesignWare® products. In one embodiment, test architecture 600 can be implemented and used during this step.

Netlist verification (step 818): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 820): Here, an overall floorplan for the chip is constructed and analyzed for timing and top-level routing. Exemplary EDA software products from Synopsys, Inc. that can be used at this step include Astro and IC Compiler products.

Physical implementation (step 822): The placement (positioning of circuit elements) and routing (connection of the same) occurs at this step. Exemplary EDA software products from Synopsys, Inc. that can be used at this step include the Astro and IC Compiler products.

Analysis and extraction (step 824): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 826): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 828): This step involves geometric manipulations of the layout to improve manufacturability of the design. Exemplary EDA software products from Synopsys, Inc. that can be used at this step include Proteus, ProteusAF, and PSMGen products.

Mask data preparation (step 830): This step provides the "tape-out" data for production of masks for lithographic use to produce finished chips. Exemplary EDA software products from Synopsys, Inc. that can be used at this step include the CATS® family of products.

Note that test architecture 600 and its functioning can be represented in software. Thus, the invention can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, the embodiments described herein are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A test architecture for testing of an integrated circuit design, the test architecture comprising:
a plurality of scan chains;
a plurality of cyclical cache chains;
a decompressor for receiving scan inputs and mapping the scan inputs to the plurality of scan chains and the plurality of cyclical cache chains;
a compressor for receiving outputs of the plurality of scan chains and the plurality of cyclical cache chains, and generating scan outputs;
inverting logic for inverting one or more values from the cyclical cache chains, the inverting logic generating a subset of the scan inputs for the decompressor; and
control logic for selecting between a linear mode and a cyclical mode,
wherein in the linear mode, only top level scan inputs are mapped to the scan chains, the top level scan inputs including any external source scan inputs, and
wherein in the cyclical mode, the outputs of the plurality of cyclical cache chains and the top level scan inputs are mapped to the scan chains.

2. The test architecture of claim 1, further including a set-up register for storing values that control the plurality of cyclical cache chains.

3. The test architecture of claim 1, wherein at least one scan chain includes a first segment, a second segment, and a multiplexer for receiving outputs of the first and second segments and allowing selective bypass of the second segment.

4. The test architecture of claim 3, further including a set-up register for storing a value that controls the multiplexer.

5. The test architecture of claim 1, further including:
blocking circuitry for programmably blocking one or more outputs of the plurality of scan chains, wherein the compressor receives outputs of the blocking circuitry.

6. The test architecture of claim 5, further including a set-up register for storing values that control the blocking circuitry.

7. A non-transitory computer-readable medium comprising computer instructions that, when run on a computer, perform a process for testing of an integrated circuit design, the process comprising:
receiving scan inputs and mapping the scan inputs to a plurality of scan chains and a plurality of cyclical cache chains;
receiving first outputs of the plurality of scan chains and second outputs of the plurality of cyclical cache chains, and generating scan outputs from the first and second outputs;
inverting one or more values from the cyclical cache chains, the inverting values being a subset of the scan inputs; and
selecting between a linear mode and a cyclical mode,
wherein in the linear mode, only top level scan inputs are mapped to the plurality of scan chains, the top level scan inputs including any external source scan inputs, and
wherein in the cyclical mode, outputs of the plurality of cyclical cache chains and the top level scan inputs are mapped to the plurality of scan chains.

8. The non-transitory computer-readable medium of claim 7, further including storing values that control the plurality of cyclical cache chains.

9. The non-transitory computer-readable medium of claim 7, wherein at least one scan chain includes a first segment and a second segment, wherein receiving the first outputs includes receiving outputs of the first and second segments and allowing selective bypass of the second segment.

10. The non-transitory computer-readable medium of claim 9, further including storing a value that controls the selective bypass.

11. The non-transitory computer-readable medium of claim 7, further including:
  programmably blocking one or more outputs of the plurality of scan chains; and
  receiving outputs of the scan chains after blocking and generating scan outputs.

12. The non-transitory computer-readable medium of claim 11, further including storing values that control the programmably blocking.

13. A test architecture for testing of an integrated circuit design, the test architecture comprising:
  a plurality of scan chains;
  a plurality of cyclical cache chains;
  means for receiving scan inputs and mapping the scan inputs to the plurality of scan chains and the plurality of cyclical cache chains;
  means for receiving outputs of the plurality of scan chains and the plurality of cyclical cache chains, and generating scan outputs;
  means for inverting one or more values from the cyclical cache chains, the means for inverting generating a subset of the scan inputs for the means for receiving outputs; and
  means for selecting between a linear mode and a cyclical mode,
  wherein in the linear mode, only top level scan inputs are mapped to the scan chains, the top level scan inputs including any external source scan inputs, and
  wherein in the cyclical mode, the outputs of the plurality of cyclical cache chains and the top level scan inputs are mapped to the scan chains.

14. The test architecture of claim 13, wherein at least one scan chain includes a first segment, a second segment, and means for receiving outputs of the first and second segments and allowing selective bypass of the second segment.

15. The test architecture of claim 13, further including:
  means for programmably blocking one or more outputs of the plurality of scan chains, wherein the means for receiving outputs receives outputs of the means for programmably blocking.

16. A method of testing of an integrated circuit design, the method comprising:
  receiving scan inputs and mapping the scan inputs to a plurality of scan chains and a plurality of cyclical cache chains;
  receiving first outputs of the plurality of scan chains and second outputs of the plurality of cyclical cache chains, and generating scan outputs from the first and second outputs;
  inverting one or more values from the cyclical cache chains, the inverting values being a subset of the scan inputs; and
  using a computer, selecting between a linear mode and a cyclical mode,
  wherein in the linear mode, only top level scan inputs are mapped to the plurality of scan chains, the top level scan inputs including any external source scan inputs, and
  wherein in the cyclical mode, outputs of the plurality of cyclical cache chains and the top level scan inputs are mapped to the plurality of scan chains.

17. The method of claim 16, wherein at least one scan chain includes a first segment and a second segment,
  wherein receiving the first outputs includes receiving outputs of the first and second segments and allowing selective bypass of the second segment.

18. The method of claim 17, further including storing a value that controls the selective bypass.

19. The method of claim 16, further including:
  programmably blocking one or more outputs of the plurality of scan chains; and
  receiving outputs of the plurality of scan chains after blocking and generating scan outputs.

20. The method of claim 19, further including storing values that control the programmably blocking.

21. A method of testing of an integrated circuit design, the method comprising:
  receiving scan inputs and mapping the scan inputs to a plurality of scan chains and a plurality of cyclical cache chains;
  receiving first outputs of the plurality of scan chains and second outputs of the plurality of cyclical cache chains, and generating scan outputs from the first and second outputs;
  processing one or more values from the plurality of cyclical cache chains, the processed values being a subset of the scan inputs; and
  using a computer, selecting between a linear mode and a cyclical mode,
  wherein in the linear mode, only first level scan inputs are mapped to the plurality of scan chains, the first level scan inputs not including internally-generated scan inputs, and
  wherein in the cyclical mode, outputs of the plurality of cyclical cache chains and the first level scan inputs are mapped to the plurality of scan chains.

22. The method of claim 21, wherein at least one scan chain includes a first segment and a second segment,
  wherein receiving the first outputs includes receiving outputs of the first and second segments and allowing selective bypass of the second segment.

23. The method of claim 22, further including storing a value that controls the selective bypass.

24. The method of claim 21, further including:
  programmably blocking one or more outputs of the plurality of scan chains; and
  receiving outputs of the plurality of scan chains after blocking and generating scan outputs.

25. The method of claim 24, further including storing values that control the programmably blocking.

* * * * *